(12) United States Patent
Biber et al.

(10) Patent No.: US 9,588,197 B2
(45) Date of Patent: Mar. 7, 2017

(54) COMBINED HF/SHIM/GRADIENT SIGNAL ROUTING

(71) Applicants: Stephan Biber, Erlangen (DE); Wolfgang Renz, Erlangen (DE); Jan Ruff, München (DE)

(72) Inventors: Stephan Biber, Erlangen (DE); Wolfgang Renz, Erlangen (DE); Jan Ruff, München (DE)

(73) Assignee: Siemens Aktiengesellschaft, München (DE)

( * ) Notice: Subject to any disclaimer, the term of this patent is extended or adjusted under 35 U.S.C. 154(b) by 567 days.

(21) Appl. No.: 14/030,641

(22) Filed: Sep. 18, 2013

(65) Prior Publication Data

US 2014/0077803 A1   Mar. 20, 2014

(30) Foreign Application Priority Data

Sep. 19, 2012   (DE) .................. 10 2012 216 813

(51) Int. Cl.
| | | |
|---|---|---|
| *G01V 3/00* | (2006.01) | |
| *G01R 33/34* | (2006.01) | |
| *G01R 33/36* | (2006.01) | |
| *G01R 33/385* | (2006.01) | |
| *G01R 33/3875* | (2006.01) | |

(52) U.S. Cl.
CPC ............. *G01R 33/34* (2013.01); *G01R 33/36* (2013.01); *G01R 33/385* (2013.01); *G01R 33/3875* (2013.01)

(58) Field of Classification Search
CPC ...................................................... G01R 33/36
USPC .......................................... 324/322, 318, 314
See application file for complete search history.

(56) References Cited

U.S. PATENT DOCUMENTS

| | | | | |
|---|---|---|---|---|
| 4,763,076 A * | 8/1988 | Arakawa | ............ | G01R 33/3657 324/318 |
| 6,844,730 B2 * | 1/2005 | Feld | .................... | G01R 33/3621 324/318 |
| 6,998,842 B2 * | 2/2006 | Sinnema | .............. | G01R 33/283 324/307 |
| 7,449,886 B2 * | 11/2008 | Buchwald | .......... | G01R 33/3621 324/311 |
| 7,696,752 B2 * | 4/2010 | Takamori | ............. | G01R 33/307 324/307 |

(Continued)

FOREIGN PATENT DOCUMENTS

| | | |
|---|---|---|
| CN | 101297193 A | 10/2008 |
| DE | 10314215 | 10/2004 |

(Continued)

OTHER PUBLICATIONS

German Office Action cited in German Application No. 10 2012 216 813.3, mailed May 29, 2013, with English Translation.

(Continued)

*Primary Examiner* — Louis Arana
(74) *Attorney, Agent, or Firm* — Lempia Summerfield Katz LLC

(57) ABSTRACT

A method and a magnetic resonance tomography (MRT) system are provided. The MRT system includes at least one cable. The MRT system is configured to transmit high frequency (HF) signals for at least one HF transmitting coil, and shim signals for at least one shim coil and/or gradient signals for at least one gradient coil in the at least one cable.

34 Claims, 1 Drawing Sheet

(56) References Cited

U.S. PATENT DOCUMENTS

| | | | |
|---|---|---|---|
| 8,135,086 B1* | 3/2012 | Sychaleun | H04L 5/06 375/260 |
| 2005/0253582 A1 | 11/2005 | Giaquinto et al. | |
| 2006/0279281 A1 | 12/2006 | Rapoport | |
| 2007/0162190 A1 | 7/2007 | Choubey | |
| 2008/0191695 A1 | 8/2008 | Van Helvoort et al. | |
| 2009/0021257 A1 | 1/2009 | Yasuhara | |
| 2010/0148778 A1 | 6/2010 | Biber | |

FOREIGN PATENT DOCUMENTS

| | | |
|---|---|---|
| DE | 102008063460 | 7/2010 |
| JP | H10201730 A | 8/1998 |
| WO | 2006103591 | 10/2006 |

OTHER PUBLICATIONS

Chinese office Action for related Chinese Application No. 201310416359.2 dated Aug. 23, 2016 with English Translation.
Korean office Action for related Korean Application No. 10-2013-0111514 dated Jun. 29, 2016.
Chinese office Action for related Chinese Application No. 2013 104 163 59.2 dated Dec. 30, 2015, with English Translation.

* cited by examiner

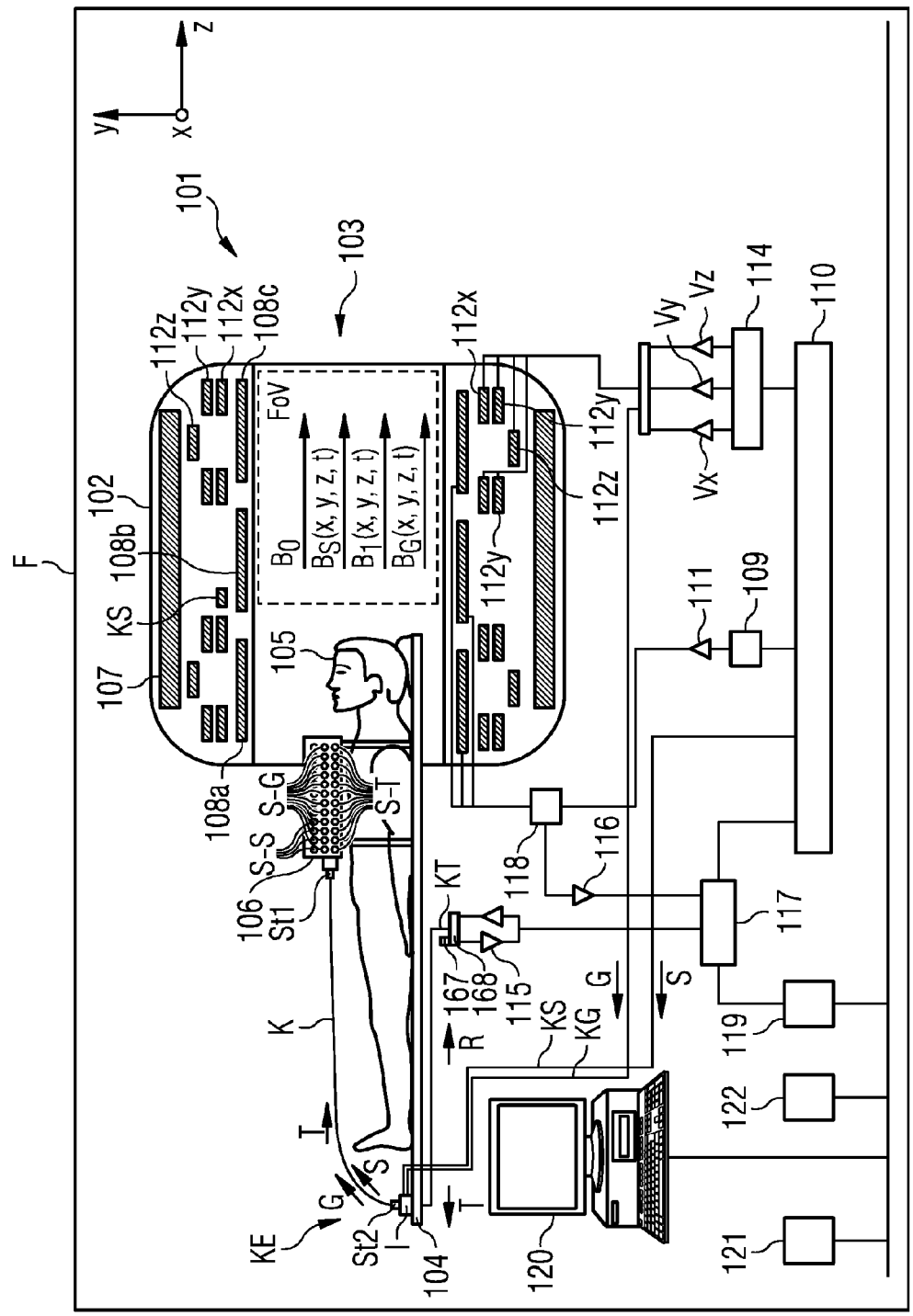

COMBINED HF/SHIM/GRADIENT SIGNAL ROUTING

This application claims the benefit of DE 10 2012 216 813.3, filed on Sep. 19, 2012, which is hereby incorporated by references in its entirety.

BACKGROUND

The present embodiments relate to a method and to an MRT with at least one cable for signal transmission.

Magnetic resonance scanners (MRTs, MRT systems) for examining objects or patients via magnetic resonance tomography are known, for example, from DE 103 14 215 B4.

SUMMARY

The scope of the present invention is defined solely by the appended claims and is not affected to any degree by the statements within this summary.

The present embodiments may obviate one or more of the drawbacks or limitations in the related art. For example, signal transmission in an MRT is optimized.

BRIEF DESCRIPTION OF THE DRAWINGS

FIG. 1 schematically shows one embodiment of a magnetic resonance tomography (MRT) system with a cable for signal transmission.

DETAILED DESCRIPTION

FIG. 1 shows one embodiment of an imaging magnetic resonance scanner MRT 101 (e.g., located in a screened room or Faraday cage F) with a whole-body coil arrangement 102 with, for example, a tubular space 103 in which a patient couch or table 104 with a body, for example, of an object to be examined 105 (e.g., of a patient; with or without local coil arrangement 106) may be moved in the direction of the arrow z to generate scans of the patient 105 via an imaging method. A local coil arrangement 106 is disposed on the patient. In a local region of the MRT (e.g., field of view (FOV)), scans of a section of the body 105 may be generated in the FOV with the local coil arrangement. Signals of the local coil arrangement 106 may be evaluated (e.g., converted into images, stored or displayed) by an evaluation device (e.g., including elements 168, 115, 117, 119, 120, 121) of the MRT 101 that may be connected, for example, by coaxial cables or radio (e.g., 167) to the local coil arrangement 106.

To examine the body 105 (e.g., the object to be examined or the patient) using magnetic resonance imaging with a magnetic resonance scanner MRT 101, various magnetic fields that are coordinated with each other as accurately as possible in terms of temporal and spatial characteristics are emitted onto the body 105. A strong magnet (e.g., a cryomagnet 107) in a measuring cabin with, for example, a tunnel-like opening 103 generates a static strong main magnetic field $B_0$ that amounts to, for example, 0.2 tesla to 3 tesla or more. The body 105 to be examined positioned on the patient couch 104 is moved into a region of the main magnetic field B0 that is substantially homogeneous in the viewing area or field of view (FoV). The nuclear spin of atomic nuclei of the body 105 is excited via magnetic high frequency excitation pulses B1(x, y, z, t) that are emitted by a high frequency antenna (and/or optionally a local coil arrangement) that is illustrated in a highly simplified manner as, for example, a body coil 108 (e.g., a multi-part body coil 108a, 108b, 108c). High frequency excitation pulses are generated, for example, by a pulse-generating unit 109 that is controlled by a pulse sequence control unit 110. Following amplification by a high frequency amplifier 111, the high frequency excitation pulses are passed to the high frequency antenna 108. The high frequency system shown is only schematically indicated. In other embodiments, more than one pulse-generating unit 109, more than one high frequency amplifier 111 and a plurality of high frequency antennas 108a, b, c are used in a magnetic resonance scanner 101.

The magnetic resonance scanner 101 also has gradient coils 112x, 112y, 112z, S-G (or optionally, also local S-G in the local coil and/or on the patient couch) with which, during a measurement, magnetic gradient fields $B_G$(x, y, z, t) are emitted for selective layer excitation and for spatial encoding of the measurement signal. The gradient coils 112x, 112y, 112z (and optionally S-G) are controlled by a gradient coil control unit 114 (and optionally by amplifiers Vx, Vy, Vz) that, like the pulse-generating unit 109, is connected to the pulse sequence-control unit 110.

Signals emitted by the excited nuclear spin (e.g., of the atomic nuclei in the object to be examined) are received by the body coil 108 and/or at least one local coil arrangement 106, amplified by associated high frequency pre-amplifiers 116 and processed further by a receiving unit 117 and digitized. The recorded measurement data is digitized and stored as complex numerical values in a k-space matrix. An associated MR image may be reconstructed from the k-space matrix occupied by values using a multi-dimensional Fourier transformation.

For a coil that may be operated in transmitting and receiving mode, such as the body coil 108 or a local coil 106, the correct signal forwarding is regulated by an upstream transceiver switch 118.

An image processing unit 119 generates an image from the measurement data, and the generated image is displayed via a control panel 120 to a user and/or is stored in a storage unit 121. A central computer unit 122 controls the individual system components.

In MR tomography, images with a high signal-to-noise ratio (SNR) may be generated using local coil arrangements (e.g., coils, local coils). The local coil arrangements are antenna systems that are provided in the immediate vicinity on top of (anterior) or below (posterior) or on or in the body 105. During an MR measurement, the excited nuclei induce a voltage in the individual antenna of the local coil, and the induced voltage is amplified using a low-noise pre-amplifier (e.g., LNA, Preamp) and is forwarded to the electronic receiving device. High field systems (e.g., 1.5T-12T or more) are used to improve the signal-to-noise ratio even in high-resolution images. If more individual antennae may be connected to an MR receiving system than there are receivers, a switch matrix (e.g., an RCCS), for example, is installed between receiving antenna and receivers. This routes the instantaneously active receiving channels (e.g., the receiving channels that are located precisely in the field of view of the magnets) to the existing receivers. As a result, more coil elements than there are receivers may be connected since in the case of whole-body coverage, only the coils that are located in the FoV or in the homogeneity volume of the magnet are to be read.

An antenna system, which may include, for example, an antenna element or, as an array coil, a plurality of antenna elements (e.g., coil elements), is designated a local coil arrangement 106. These individual antenna elements are configured, for example, as loop antennae (e.g., loops), butterfly, flex coils or saddle coils. A local coil arrangement includes, for example, coil elements, a pre-amplifier, further electronic devices (e.g., sheath wave traps), a housing, supports and may include a cable with connectors, by which the local coil arrangement is connected to the MRT system. A receiver 168, provided on the system, filters and digitizes a signal received by a local coil 106, for example, via radio and passes the data to a digital signal processing device that may derive an image or a spectrum from the data obtained by a measurement and makes the spectrum available to the user, for example, for subsequent diagnosis by the user and/or storage.

FIG. 1 shows an exemplary embodiment of an MRT system 101 with a cable K (e.g., with sockets and/or connectors St1 and/or St2) for signal transmission from, for example, an interface I on an patient couch 104 to a local coil 106 that has transmitting coils S-T (e.g., for transmitting fields ($B_1(x, y, z, t)$) in accordance with HF signals T and also for receiving) and/or shim coils S-S (e.g., for generating static or quasi static (frequencies less than 10 kHz) fields ($B_S(x, y, z, t)$) in accordance with shim signals S) and/or gradient coils S-G (e.g., for transmitting fields ($B_G(x, y, z, t)$) in accordance with gradient signals G).

Gradient signals G are transmitted from a gradient system controller 114 to an interface I on a patient couch 104 via a cable KG. Shim signals S are transmitted from a shim signal controller (e.g., in 110) to an interface I on a patient couch 104 via a cable KS. HF signals T are transmitted from an HF signal-generating device 117 to an interface I on the patient couch 104 via a cable KT. Gradient signals G and/or shim signals S and/or HF signals T may also be transmitted to the interface I jointly via a cable KG, for example, in a cable section that ends at the interface I and/or runs through the patient couch 104 and/or to the patient couch 104.

Local multi-channel transmitting coils 106, for example, and/or local shim coils S-S (e.g., in a local coil and/or the patient couch) may be used as the local coil 106 in MRT systems in, for example, the UHF range. With N HF transmitting channels and M shim channels, N+M signal feeds are used. Owing to the number of channels and the cable cross sections used, the cables or cable bundles may quickly assume dimensions that are very difficult to manage. Known concepts use separate signal feeds for the HF and shim channels (e.g., N+M cables in total; one cable includes signal outward path and return path). The number of HF channels and the local shim channels may potentially be fairly close (e.g., eight to sixteen). Coaxial cables are used for the HF channels. Coaxial cables may also be used for the shim cables since the coaxial cables enable Lorentz force-free signal routing in addition to screening.

One embodiment includes a shared use of a cable K or a plurality of cables (e.g., optionally also of KG, KS, KT) both for an HF signal (T,R) transmission and for a shim signal (S) transmission (e.g., one HF channel and one shim channel per coaxial cable K). In other words, the shared use of the cable is for feeding a combination of local HF transmitting and shim arrays in, for example, the local coil 106 (and/or in the patient couch). The number of cables used may be reduced, for example, to about half as a result. Feeding and exiting of the signals (T, (R for received signals), S and optionally also G) may be provided without particular effort owing to the widely separated frequency ranges. The copper cross section of a typical 10 mm transmitting coaxial cable is sufficiently dimensioned for the expected shim currents in the ampere range. Owing to the skin effect, most of the copper cross section is unused in the case of pure HF transmission.

A clear reduction in the number of cables used may result, with advantages in terms of costs and cable routing, due to the multiple occupation of signal feeds to local transmitting and shim arrays by signals that are in widely separated frequency ranges. One or more of the present embodiments may also be used for the combined feeding of local multi-channel HF transmitting arrays and gradient arrays in the case of gradient currents that are not too excessive or suitable (e.g., thick) cables.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for transmitting signals in a cable in an imaging magnetic resonance tomography (MRT) system, the method comprising:
   transmitting, with the cable, a combination of high frequency (HF) signals for an HF transmitting local coil of the imaging MRT system and shim signals for a shim coil, gradient signals for a gradient coil, or the shim signals and the gradient signals,
   wherein the local coil comprises the shim coil, the gradient coil, or the shim coil and the gradient coil.

2. The method as claimed in claim 1, wherein the transmitting comprises transmitting the combination of only the HF signals and the shim signals with the cable.

3. The method as claimed in claim 1, wherein the transmitting comprises transmitting the combination of only the HF signals and the gradient signals with the cable.

4. The method as claimed in claim 1, wherein the transmitting comprises transmitting the combination of the HF signals, the shim signals, and the gradient signals with the cable.

5. The method as claimed in claim 1, wherein transmitting in the cable comprises transmitting in a coaxial cable.

6. The method as claimed in claim 1, wherein the cable is a first cable, and wherein the method further comprises:
   providing the first cable and the second cable to the local coil of the MRT system,
   wherein the transmitting comprises transmitting the combination of the HF signals and the shim signals, the gradient signals, or the shim signals and the gradient signals with the first cable and the second cable.

7. The method as claimed in claim 6, wherein providing the first cable and the second cable to the local coil comprises providing the first cable and the second cable to a multi-channel coil.

8. The method as claimed in claim 7, wherein the HF transmitting coil comprises one of a plurality of transmitting coils, the shim coil comprises one of a plurality of shim coils, and the gradient coil comprises one of a plurality of gradient coils, and wherein the multi-channel coil comprises the plurality of transmitting coils and the plurality of shim coils, the plurality of gradient coils, or the plurality of shim coils and the plurality of gradient coils.

9. The method as claimed in claim 6, wherein transmitting with the first cable and the second cable comprises transmitting:

exactly one HF channel in the form of a transmission of the HF signals to at least one HF transmitting coil of the local coil; and exactly one shim channel in the form of a transmission of the shim signals to at least one shim coil of the local coil, exactly one gradient channel in the form of a transmission of the gradient signals to at least one gradient coil of the local coil, or the exactly one shim channel and the exactly one gradient channel.

10. The method as claimed in claim 6, wherein an HF channel in the cable comprises transmitting at least some of the HF signals to at least one transmitting coil of the local coil, a shim channel in the cable comprises transmitting at least some of the shim signals to at least one shim coil of the local coil, a gradient channel comprises transmitting at least some of the gradient signals to at least one gradient coil of the local coil, or a combination thereof.

11. The method as claimed in claim 1, wherein the transmitting comprises transmitting shim signals with shim currents of 0.5-10 ampere.

12. The method as claimed in claim 1, wherein the transmitting comprises transmitting in the cable with a copper cross section that is five to twenty mm.

13. The method as claimed in claim 12, wherein the copper cross section is ten mm.

14. The method as claimed in claim 1, wherein the cable runs between a local coil and an interface on the MRT system, an interface on a patient couch, or an interface on the MRT system and an interface on the patient couch.

15. The method as claimed in claim 1, further comprising feeding the HF signals and the shim signals, the gradient signals, or the shim signals and the gradient signals into the cable.

16. A magnetic resonance tomography (MRT) system comprising:

a transmitting local coil comprising a shim coil, a gradient coil, or the shim coil and the gradient coil; and a cable, wherein the cable is configured to transmit:

a combination of high frequency (HF) signals for the HF transmitting local coil and shim signals for a shim coil, gradient signals for a gradient coil, or the shim signals and the gradient signals.

17. The MRT system as claimed in claim 16, wherein the cable is configured to transmit the combination of only the HF signals and the shim signals.

18. The MRT system as claimed in claim 16, wherein the cable is configured to transmit the combination of only the HF signals and the gradient signals.

19. The MRT system as claimed in claim 16, wherein the cable is configured to transmit the combination of the HF signals, the shim signals, and the gradient signals.

20. The MRT system as claimed in claim 16, wherein the cable is a coaxial cable.

21. The MRT system as claimed in claim 16, wherein the cable comprises one of a plurality of cables, and wherein the plurality of the cables, interfaces for the plurality of cables, or the plurality of cables and the interfaces for the plurality of cables are configured such that the plurality of cables transmit the combination of the HF signals and the shim signals, the gradient signals, or the shim signals and the gradient signals.

22. The MRT system as claimed in claim 16, the transmitting local coil that is a multi-channel coil.

23. The MRT system as claimed in claim 22, wherein the multi-channel coil comprises a plurality of transmitting coils, a plurality of shim coils, a plurality of gradient coils, or a combination thereof.

24. The MRT system as claimed in claim 22, wherein the cable comprises:

exactly one HF channel in the form of a transmission of the HF signals to the at least one HF transmitting coil of the local coil; and exactly one shim channel in the form of the transmission of the shim signals to the at least one shim coil of the local coil, exactly one gradient channel in the form of the transmission of the gradient signals to the at least one gradient coil of the local coil, or the one shim channel and the one gradient channel.

25. The MRT system as claimed in claim 22, wherein an HF channel in the cable includes the transmission of the HF signals to the at least one HF transmitting coil of the local coil, a shim channel in the cable includes the transmission of the shim signals to the at least one shim coil of the local coil, a gradient channel includes the transmission of the gradient signals to the at least one gradient coil of the local coil, or a combination thereof.

26. The MRT system as claimed in claim 16, wherein the shim signals are shim currents of 0.5-10 ampere.

27. The MRT system as claimed in claim 20, wherein a copper cross section of the coaxial cable is 5-20 mm.

28. The MRT system as claimed in claim 27, wherein the copper cross section is 10mm.

29. The MRT system as claimed in claim 16, wherein the cable runs between a local coil and an interface on a patient couch.

30. The MRT system as claimed in claim 16, wherein the cable runs between an interface on the MRT system, on a patient couch, or on the MRT system and the patient couch, and a further device of the MRT system.

31. The MRT system as claimed in claim 16, wherein the cable runs from an interface through a patient couch.

32. The MRT system as claimed in claim 16, wherein an interface is provided for feeding the combination of the HF signals and the shim signals, the gradient signals, or the shim signals and the gradient signals into the cable that rests on the interface.

33. The MRT system as claimed in claim 16, wherein the the cable is one of a plurality of cables, the plurality of cables together forming a cable bundle.

34. The MRT system as claimed in claim 33, wherein the cable bundle runs from a local coil to an interface, the cable bundle runs from the interface through a patient couch, the cable bundle runs from the patient couch to a further device of the MRT system, or a combination thereof.

* * * * *